United States Patent
Mahoney et al.

(10) Patent No.: US 9,258,081 B2
(45) Date of Patent: Feb. 9, 2016

(54) HIGH DYNAMIC RANGE AMAM PREDISTORTION

(71) Applicant: MStar Semiconductor, Inc., Hsinchu Hsien (TW)

(72) Inventors: Dennis Mahoney, Greensboro, NC (US); Khurram Muhammad, Garland, TX (US)

(73) Assignee: MStar Semiconductor, Inc., Hsinchu Hsien (TW)

( * ) Notice: Subject to any disclaimer, the term of this patent is extended or adjusted under 35 U.S.C. 154(b) by 185 days.

(21) Appl. No.: 13/760,184

(22) Filed: Feb. 6, 2013

(65) Prior Publication Data

US 2014/0219391 A1    Aug. 7, 2014

(51) Int. Cl.
| | | |
|---|---|---|
| *H04K 1/02* | (2006.01) | |
| *H04L 1/00* | (2006.01) | |
| *H03F 1/32* | (2006.01) | |
| *H04L 27/36* | (2006.01) | |

(52) U.S. Cl.
CPC ............ *H04L 1/0033* (2013.01); *H03F 1/3241* (2013.01); *H03F 2200/336* (2013.01); *H03F 2201/3233* (2013.01); *H04L 27/367* (2013.01)

(58) Field of Classification Search
CPC .. H04B 3/32; H04L 25/03343; H04L 27/368; H03F 1/3247

USPC .......................................................... 375/295
See application file for complete search history.

(56) References Cited

U.S. PATENT DOCUMENTS

| | | | | |
|---|---|---|---|---|
| 6,266,517 | B1* | 7/2001 | Fitzpatrick et al. | 455/114.3 |
| 8,054,912 | B2 | 11/2011 | Ba et al. | |
| 2003/0207680 | A1* | 11/2003 | Yang | H03F 1/3247 455/341 |
| 2006/0291589 | A1 | 12/2006 | Eliezer et al. | |
| 2009/0004981 | A1* | 1/2009 | Eliezer et al. | 455/127.1 |
| 2011/0151806 | A1* | 6/2011 | Kenington | 455/101 |

* cited by examiner

*Primary Examiner* — Dac Ha
*Assistant Examiner* — Janice Tieu
(74) *Attorney, Agent, or Firm* — Edell, Shapiro & Finnan, LLC

(57) ABSTRACT

A predistortion function is evaluated with in-phase (I) and quadrature (Q) data words as arguments, while additive I and Q data words are generated in accordance with a comparison of the I and Q data words with a full scale value that generates maximum current in a digital power amplifier. The additive I and Q data words are added to the computed I and Q data words to produce predistorted I and Q data words. The predistorted I and Q data words are provided in a sequence to the digital power amplifier, which generates a corresponding radio-frequency (RF) analog signal.

17 Claims, 6 Drawing Sheets

HIGH DYNAMIC RANGE AMAM PREDISTORTION

TECHNICAL FIELD

The present disclosure relates to predistortion in digital modulators.

BACKGROUND

Amplitude-modulation (AM) to AM (AM-AM) distortion is a third order intermodulation distortion (IMD) effect by which the magnitude of the output signal of a system is compressed or expanded, referred to as compansion or the state of being companded, in response to changes in current amplitude in a digital power amplifier (DPA), or in radio-frequency (RF) power amplifiers in general. Highly linear amplifiers exhibit the least distortion and, as such, are preferred when signal quality has precedence over cost. However, such highly linear amplifiers operate at high power levels and are relatively large and expensive. And, while such linear amplifiers offer the best performance, they are typically not used in wireless applications where cost is a factor.

To strike a balance between efficiency, linearity and cost, a DPA may be designed to exhibit known nonlinearity. Predistortion may then be used to compensate for this nonlinearity, resulting in a linearization of the output of the DPA. That is, if the DPA's distortion characteristics are known in advance, an inverse function, referred to herein as a predistortion function, can be applied to the input data prior to reaching the DPA. The DPA distortion is essentially cancelled by the predistortion resulting in an amplified output signal having substantially reduced distortion.

Digital predistortion is most often carried out through a lookup table (LUT) that associates predistorted output data values with input data values. That is, entries in the LUT are addressed by the samples of the input data. The LUT is typically populated by way of calibration procedures designed to detect AM-AM distortion. One limitation of LUT-based predistortion in digital transmitters using a DPA is that data samples must be converted and transmitted at a very high rate. Thus, a predistorter must look up and retrieve output values very quickly. Another drawback is the LUT's inherent quantization, even when the LUT is interpolated. This is especially problematic at low output current levels, i.e., when fewer current cells in the DPA are conducting. Activating additional current cells in the DPA responsive to an increasing number of bits in the data represents a higher degree of current change from step to step than at higher power levels. As such, quantization effects have a greater impact at lower power levels than at higher power levels.

Given the state of the current art, the need is apparent for a high dynamic range predistortion technique that results in smoother transitions between power levels across the entire range of input data while realizing an arbitrarily nonlinear predistortion function.

SUMMARY

Each of a pair of input in-phase (I) and quadrature (Q) data words is provided as arguments to a predistortion function to generate computed I and Q data values. Additionally, additive I and Q data words are generated in accordance with a comparison of the input I and Q data words with a full scale value that generates maximum current in a digital power amplifier. The additive I and Q data words are added to the computed I and Q data words to produce the predistorted I and Q data words. The predistorted I and Q data words are provided in a sequence to the digital power amplifier, which generates a corresponding radio-frequency (RF) analog signal.

DESCRIPTION OF EXAMPLE EMBODIMENTS

Figure 1:
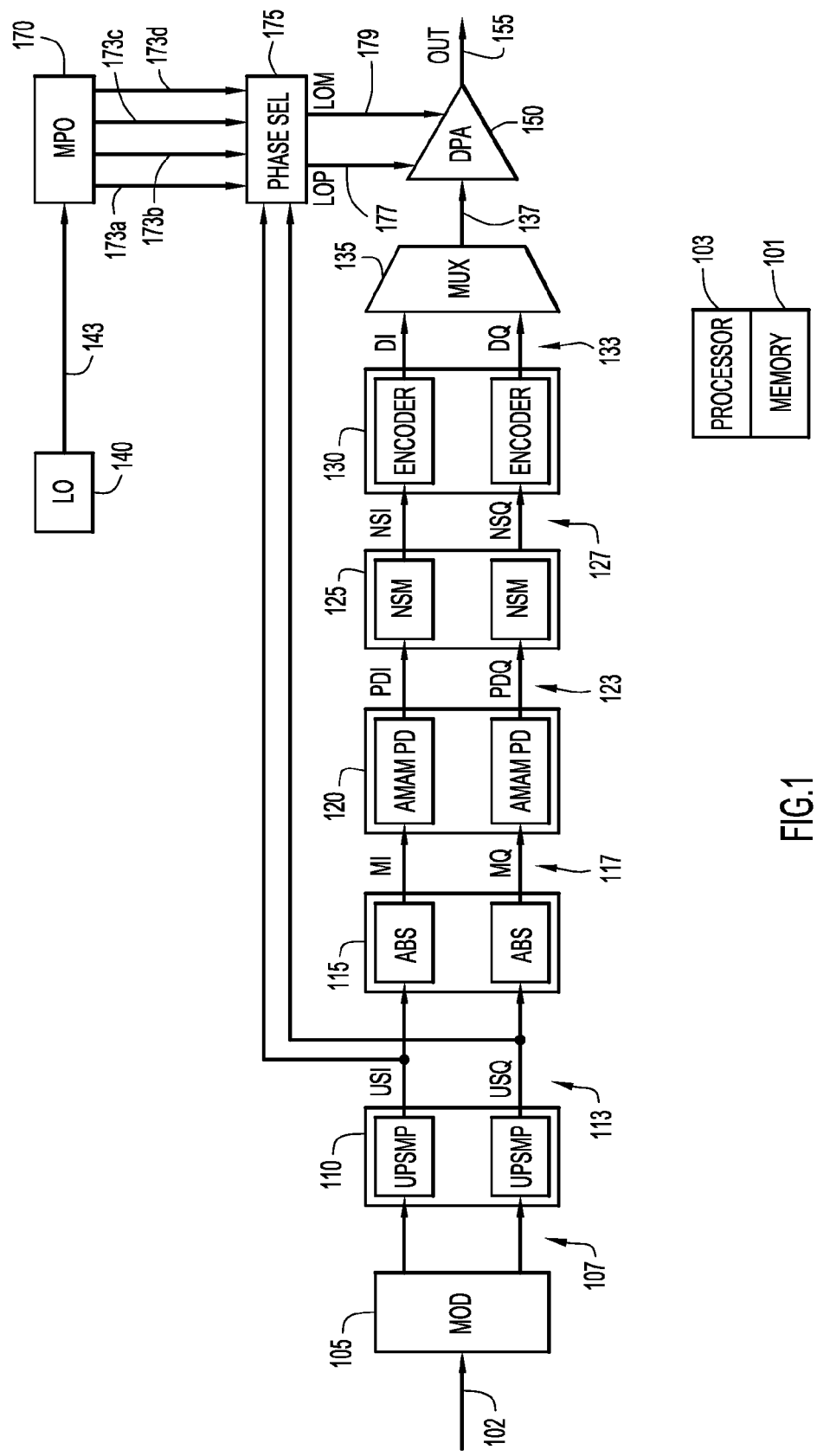
FIG. 1 is a schematic block diagram of a digital quadrature transmitter by which the present general inventive concept can be embodied.

The present inventive concept is best described through certain embodiments thereof, which are described in detail herein with reference to the accompanying drawings, wherein like reference numerals refer to like features throughout. It is to be understood that the term invention, when used herein, is intended to connote the inventive concept underlying the embodiments described below and not merely the embodiments themselves. It is to be understood further that the general inventive concept is not limited to the illustrative embodiments described below and the following descriptions should be read in such light.

Additionally, mathematical expressions are contained herein and those principles conveyed thereby are to be taken as being thoroughly described thereby. It is to be understood that where mathematics are used, such is for succinct description of the underlying principles being explained and, unless otherwise expressed, no other purpose is implied or should be inferred. It will be clear from this disclosure overall how the mathematics herein pertain to the present invention and, where embodiment of the principles underlying the mathematical expressions is intended, the ordinarily skilled artisan will recognize numerous techniques to carry out physical manifestations of the principles being mathematically expressed.

FIG. 1 is a schematic block diagram of a digital transmitter 100 by which an information-bearing digital signal 102 may be modulated onto a carrier signal having a frequency $F_C$. The carrier signal frequency, $F_C$ may be established by a local oscillator (LO) 140. It is to be understood that digital transmitter 100 is but one example configuration; other system configurations and signals may embody the present invention without departing from the spirit and intended scope thereof.

Digital transmitter 100 may include, for example, a processor 103 and a memory 101 to implement functionality described herein. That is, certain signal processing operations described below may be carried out by way of processor 103 executing processing instructions in memory 101. However, it is to be understood that the present invention can be carried out in a wide variety of fixed and programmable logic, as well as other digital and analog circuitry.

Digital signal 102 may be modulated into a baseband signal 107 by modulator 105. Baseband signal 107 may comprise data symbols having real and imaginary components, referred to herein as in-phase (I) and quadrature (Q) data words, that together represent time varying phase and amplitude in baseband signal 107. That is, data in baseband signal 107 can be conceptualized as a complex number z=i+jq, for I=i and Q=q, having, at any instant in time, amplitude r=$\sqrt{i^2+q^2}$ and phase:

$$\phi = \arg(i, q) = \begin{cases} \arctan(q/i), & i > 0 \\ \pi/2 - \arctan(i/q), & q > 0 \\ -\pi/2 - \arctan(i/q), & q < 0 \\ \pi + \arctan(q/i), & i < 0, y \geq 0 \\ -\pi + \arctan(q/i), & i < 0, q < 0 \\ \text{Undefined}, & i = 0, q = 0. \end{cases}$$

where r and φ are taken with respect to the origin and positive real axis, respectively, in a complex number plane having real and imaginary axes. It is to be noted from the above that r and φ can be determined from |i|, |q|, and the algebraic signs of both i and q.

As illustrated in FIG. 1, signal processing in digital transmitter 100 that is subsequent to baseband modulation and prior to multiplexing data into a single stream, as will be described below, occurs in separate but similarly constructed processing channels, referred to herein as I and Q channels, respectively. Thus, while certain processing components in FIG. 1 may be described herein as if being realized by a single component, the ordinarily skilled artisan will recognize and appreciate that such description carries the implication of multiple components performing like operations in separate I and Q processing channels.

Baseband signal 107 may be upsampled by upsampler 110 to produce an upsampled baseband signal 113 that increases the resolution of the output signal and affords a reduction of the output noise floor close to the carrier frequency. Signal 113 may be provided to an absolute value processor 115 by which each data word USI, USQ of signal 113 is stripped of its algebraic sign to produce signal 117. The algebraic signs of USI, USQ are provided to phase select processor 175 where they may be stored for a number of processing cycles sufficient to account for processing delays from the output of upsampler 110 to digital power amplifier (DPA) 150.

The output of absolute value processor 115 comprising signal components MI and MQ may be provided to AM-AM predistortion processor 120, by which the data in I and Q channels are predistorted in accordance with a target predistortion function. The values carried in the digital words provided to DPA 150 may range from zero (0) to some full scale value, which is dependent on the encoding scheme of encoder 130. The encoding scheme may be selected for efficient conversion by the applicable digital-to-analog conversion architecture in DPA 150. For example, in addition to implementing digital-to-analog data conversion, an encoding scheme may incorporate shuffling or dynamic element matching techniques to select DAC cells in a manner that minimizes cell mismatch effects. In certain embodiments, encoder 130 translates the symbols of signal 127 to unary coded symbols (for example, thermometer coding) by which bit states in the coded symbols of signal 137 are used to select states of current cells in a digital-analog converter (DAC) incorporated in DPA 175. For example, a unary coded zero (0) selects no cell, i.e., all current cells are in a non-conducting state, and unary-coded full scale, e.g., N ones (1) followed by a zero (0) in the least significant bit position for a total of N+1 bits, corresponds to selection of all cells, i.e., all current cells are in a conducting state. When so embodied, the DAC outputs maximum current at full-scale encoder value and outputs zero current at the minimum encoder value. It is to be understood, however, that the present invention is not limited to any particular DAC encoding scheme.

In certain implementations, thermometer encoding may offer benefits over binary coded DACs. Transitions between certain codes, such as from binary-coded 7 (0111b) to binary-coded 8 (1000b) or from binary-coded 15 (1111b) to binary-coded 16 (10000b) (more generally $2^N-1$ to $2^N$) can create undesirable signal artifacts. For example, when transitioning from code 15 (1111b) to 16 (10000b), four DAC current cells are switched off concurrently with a fifth cell being turned on. Cell switching at such code boundaries may create glitches due in part from timing mismatches as devices of smaller sizes are turned off and larger devices are turned on. Size mismatches between elements may also introduce anomalies. Such mismatches can make the prediction of DAC output particularly challenging. Encoding by thermometer codes may provide a significant reduction in signal anomalies that are unrelated to DPA compansion.

At the binary-coded DPA output, all disturbances and degradations are observed together and the output signal can deviate from the ideal output in a manner that is difficult to fix without using predistortion. Predistortion, therefore, allows the use of binary coded DACs with timing alignment and size mismatches, as will be appreciated by the ordinarily skilled artisan. The mismatches in the binary encoded DAC will show up during calibration as integral non-linearities/differential non-linearities (INL/DNL), which can be compensated for through the present invention in addition to compensation for compansion. However, implementing thermometer encoding greatly simplifies the requirements on how well predistortion must work over temperature and frequency as it needs to compensate primarily for distortion created only in the DAC and/or a following power amplifier.

Predistorted signal 123 may be provided to noise-shaping modulator (NSM) 125. NSM 125, in turn, modifies the frequency content of pre-distorted signal 123 so as to reduce the spectral power in a selected frequency band. Such noise shaping may be achieved by sigma-delta modulation, but the present invention is not so limited. NSM 125 frequency shifts quantization noise of not only the sampling noise in transmitter 100 itself, but also of that generated in the predistortion processor 120. The output of NSM 125, i.e. signal 127, is provided to encoder 130.

Signal 127 at the output of NSM 125 may be provided to encoder 130 by which signal 127 is encoded as described above. Encoded signal 133 may be multiplexed into a multiplexed data stream 137 by multiplexer 135. Data stream 137 may be a sequence {DI, DQ, DI, DQ, . . . } where DI and DQ are the outputs of encoder 130 by respective I and Q processing channels thereof. Multiplexed data stream 137 may be provided to DPA 150, which produces an amplified analog signal 155 carrying the information of information-bearing data 102 at the carrier frequency $F_C$. In certain embodiments, DPA 150 comprises a radio-frequency DAC (RFDAC) that generates an analog signal from encoder values at the carrier frequency $F_C$. However, it is to be understood that the present invention is not limited to a particular architecture of DPA 150. For example, DPA 150 may be embodied as a differential amplifier that produces a differential output signal 155.

Figure 2:
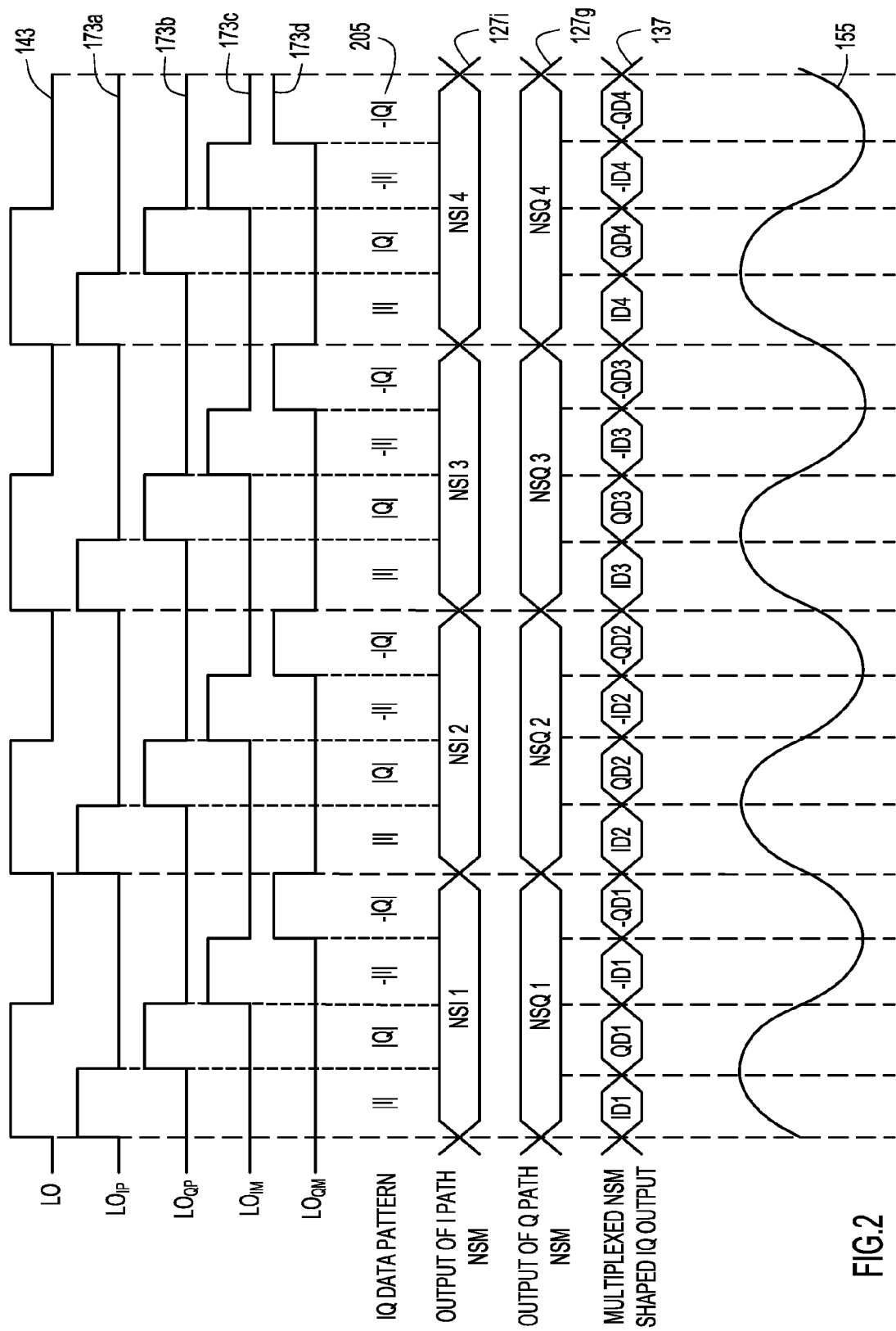
FIG. 2 is a timing diagram illustrating 25% duty cycle timing of the digital quadrature transmitter illustrated in FIG. 1.

Digital transmitter 100 includes a multiphase oscillator (MPO) 170 to generate phase signals 173a-173d, representatively referred to herein as phase signal(s) 173. Phase signals 173 may be applied to DPA 150 through phase select circuit 175, which, in turn, provides cell bank selection signals LOP 177 and LOM 179 to DPA 250. Cell bank selection signals LOP 179 and LOM 177 may be provided to cell banks of DPA 250 in an order defined by the up-conversion of the original baseband signal 113. This is clarified through the timing diagram illustrated in FIG. 3, where LO signal 143 is provided from LO 140 to MPO 170 to generate phase signals 173. It is to be understood that while phase signals 173 are illustrated in FIG. 2 as having 25% duty cycle non-overlapping pulses, the present invention is not so limited. The present invention may also be implemented for a lower duty-cycle non-overlapping LO based system with 90 degree phase separation and other non-90 degree LO based solutions. For example, the present invention may be implemented for 50% duty cycle timing, where the output signal is produced from |I−Q| and |I+Q| values in signal 117, although 25% duty cycle direct conversion systems may have better I/Q balance and conversion gain. The ordinarily skilled artisan will recognize DPA DAC timing schemes other than those described herein that can be used in conjunction with the present invention.

The data is to be converted in a prescribed order to produce a correct analog signal OUT, i.e., output signal 155. Output signal 155 may be produced from the sequence {I, Q, −I, −Q, I, Q, −I, −Q . . . } or, equivalently, {|I|, |Q|, −|I|, −|Q|, |I|, |Q|, −|I|, −|Q|, . . . }, which is illustrated as data pattern 205 in FIG. 2. The data provided to DPA 150 is derived from the absolute values of the noise-shaped data, i.e., {|MI|, |MQ|, |MI|, |MQ|, |MI|, |MQ|, |MI|, |MQ|, . . . } and the algebraic signs thereof are used only to determine the direction of current in a load (not illustrated) connected to DPA 150. As such, the algebraic signs are used to select the phase of the phase signal 173, e.g.,:

TABLE 1

| Case | Phase Selected |
| --- | --- |
| MI > 0 and MQ > 0 | $LO_{IP}$ (Phase 0) to LOP |
| MI > 0 and MQ < 0 | $LO_{QM}$ (Phase 3) to LOM |
| MI < 0 and MQ > 0 | $LO_{QP}$ (Phase 1) to LOP |
| MI < 0 and MQ < 0 | $LO_{IM}$ (Phase 2) to LOM |

DPA 150 accepts DI and DQ inputs in data stream 137, as sampled by phase signals 173, and up-converts the original modulated signal 107 by converting the values DI, DQ, −DI, −DQ at four (4) times the LO rate, i.e., these four outputs DI, DQ, −DI, −DQ are sampled by phase signals 173 inside one cycle of LO 140. The converted output signal 155 thus has the period of LO, which corresponds to the carrier frequency $F_C$.

Figure 3:
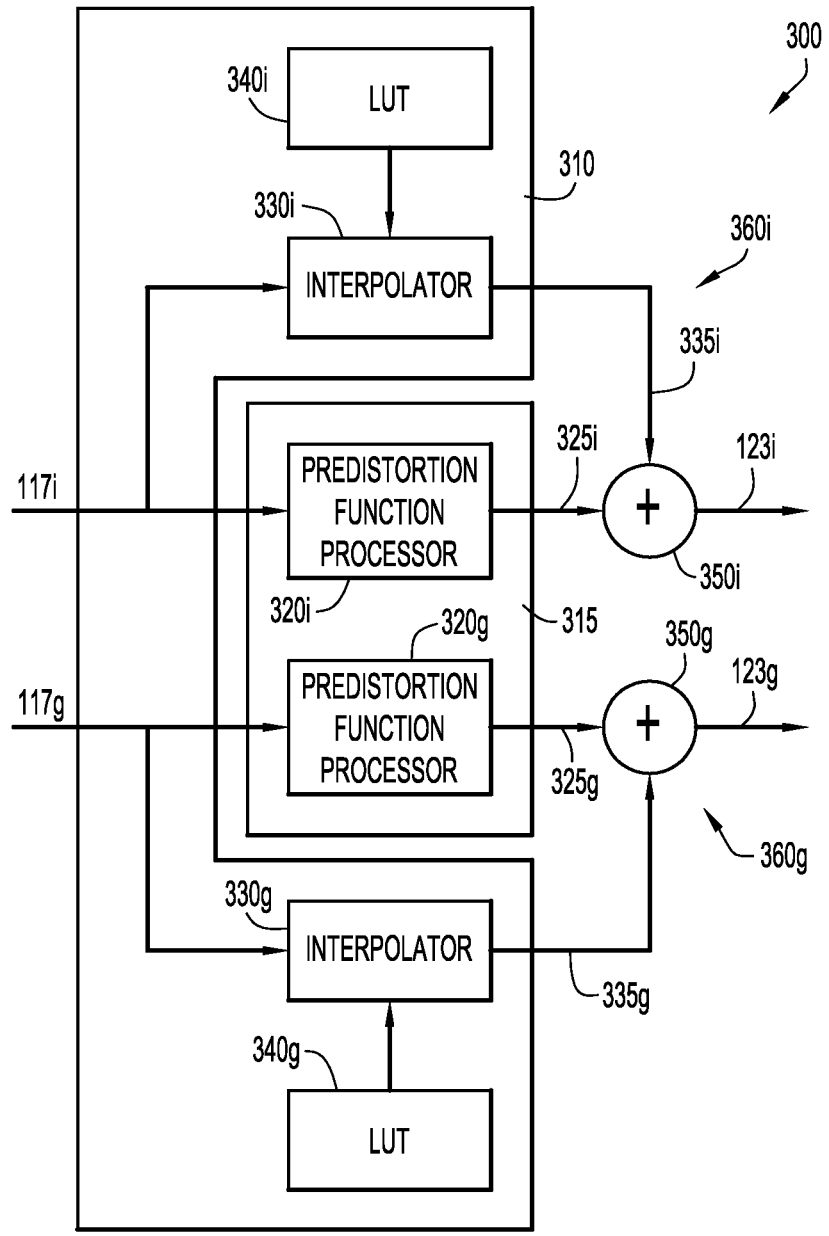
FIG. 3 is a schematic block diagram of an exemplary predistortion processor 300 by which the present general inventive concept can be embodied.

FIG. 3 is a schematic block diagram of an exemplary predistortion processor 300 by which the present invention can be embodied. Predistortion 300 may comprise a predistorter in each of the I channel and the Q channel, representatively illustrated by predistorters 360i and 360q and representatively referred to herein as predistorter(s) 360. In certain embodiments, the predistorters 360 in the I and Q channels are identical.

Predistortion processor 300 predistorts incoming signal 117 comprising the pair of signals 117i and 117q by way of two operational stages: a multiplicative stage 315 and an additive stage 310. From absolute value processor 115, signal 117 is provided to multiplicative stage 315, comprising a pair of predistortion function processors 320i and 320q, representatively referred to herein as predistortion function processor(s) 320, which produces a computed signal 325, comprising the pair of signals 325i and 325q. That is, the input signal 117 is provided as an argument to the predistortion function implemented by multiplicative stage 315. At the same time, signal 117 is provided to additive stage 310, which produces additive signal 335 comprising signals 335i and 335q. Computed signal 325 and additive signal 335 are provided to adders 350i and 350q, which sum the computed signal 325 and the additive signal 335 into predistorted signal 123 comprising the pair of signals 123i and 123q. Predistorted signal 123 is provided to NSM 125.

In certain embodiments, predistortion function processor 300 may implement a predetermined polynomial using the data words of signal 117 as arguments, e.g., $$x_{325} = \Sigma_{i=0}^{n} a_i x_{117}^{i}, \quad (1)$$

where n is the order of the polynomial, $x_{325}$ is a data word of signal 325, $x_{117}$ is a data word of signal 117 and $a_i$ are weighting coefficients. The present invention is not limited to any particular technique by which the polynomial is applied to the data words of signal 117 or to the form of the polynomial applied. Indeed, curve fitting techniques other than by polynomials may be used in conjunction with the present invention without departing from the spirit and intended scope thereof.

The polynomial of, for example, Eq. 1 may be applied by predistortion function processor 320 to compensate for AM-AM distortion in digital transmitter 100. However, to minimize the computational burden of polynomial evaluation, embodiments of the present invention implement a lower order polynomial, e.g., n=5, and may compensate any deviation from a target predistortion function due to the low-order model by way of additive signal 335. The polynomial predistorter produces a very smooth modifier over the dynamic range of the input signal and restricting its order allows the control of average predistortion applied. The deviation of this average from the intended predistortion may then be applied using the additive terms (335i, 335q) from the interpolated LUT.

Figure 4:
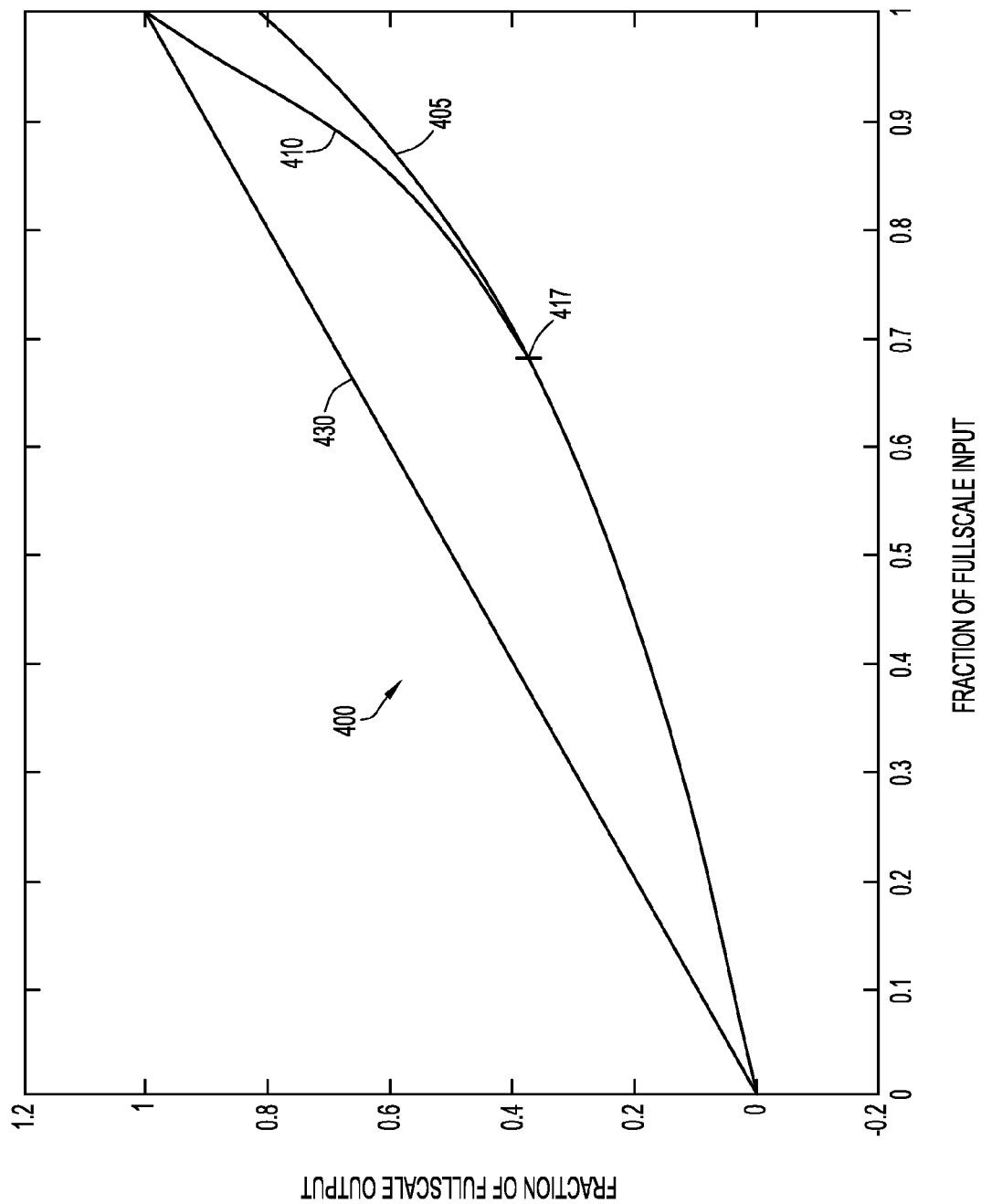
FIG. 4 is a graph of an exemplary output of the predistortion processor illustrated in FIG. 3.

FIG. 4 is a graph of predistortion curves 400 for demonstrating operation of predistortion processor 300 illustrated in FIG. 3. The graph is constructed to have fractions of full scale values for data words of signal 117 as the ordinate and fractions of full scale values for data words of signal 123 as the abscissa. The line labeled 430 illustrates a linear relationship, i.e., no predistortion and no nonlinearity, curve 405 illustrates low order polynomial predistortion alone and curve 410 illustrates the target predistortion curve. As illustrated in FIG. 4, the polynomial predistortion function curve 405 tracks the target predistortion function curve 410 well up to a threshold value 417. Above this threshold value 417, additive stage 310 compensates for the difference between the predistortion function 405 and the target predistortion function 410. Below the threshold value 417, the additive stage 310 may generate zero-valued additive data words. This technique allows very fine control of quantization noise produced by the LUT in the low signal power region, whereas the quantization noise becomes a less significant contributor at high output signal power region.

Returning to FIG. 3, additive stage 310 comprises interpolators 330i and 330q, representatively referred to herein as interpolator(s) 310 and lookup tables (LUT) 340i and 340q, representatively referred to herein as LUT(s) 340. LUT 340 may be stored in memory 101 and may contain associations between data words of input signal 117 and corresponding additive data words. In certain embodiments, interpolator 330 retrieves a value from LUT 340 at a location indexed by the data word of input signal 117. If no index for the data word exists, interpolator 330 applies an interpolation function that generates an additive data word from neighboring additive data words in LUT 340 at respective indexes that encompass the input data word of signal 117. It is to be understood that the present invention can be embodied without an interpolator, i.e., the additive data word is retrieved directly from LUT 340. It is to be understood as well that although additive stage 310 is illustrated in FIG. 3 as comprising a pair of identical LUTs, a single LUT may be shared between I and Q data channels.

While polynomial modulation generates smooth and continuous output, a lookup table is quantized, even when interpolated, and exhibits quantization artifacts such as jaggedness. These quantization effects may be ameliorated by suitably configuring NSM 125 so as to move the corresponding quantization noise into higher frequencies that are outside the operational bounds of transmitter 100.

It is to be understood that different low-order polynomials (e.g. order less or equal to 5) can be piecewise fit to different regions of the desired predistortion curve and assembled into a single curve that encompasses the dynamic range of the signal. In certain embodiments, the additive term may be used to provide a correction between segments so as to make the overall curve continuous. In certain embodiments, an additive term may not be required if the multiple polynomials are continuous from one compensating polynomial segment to the next.

Figure 5:
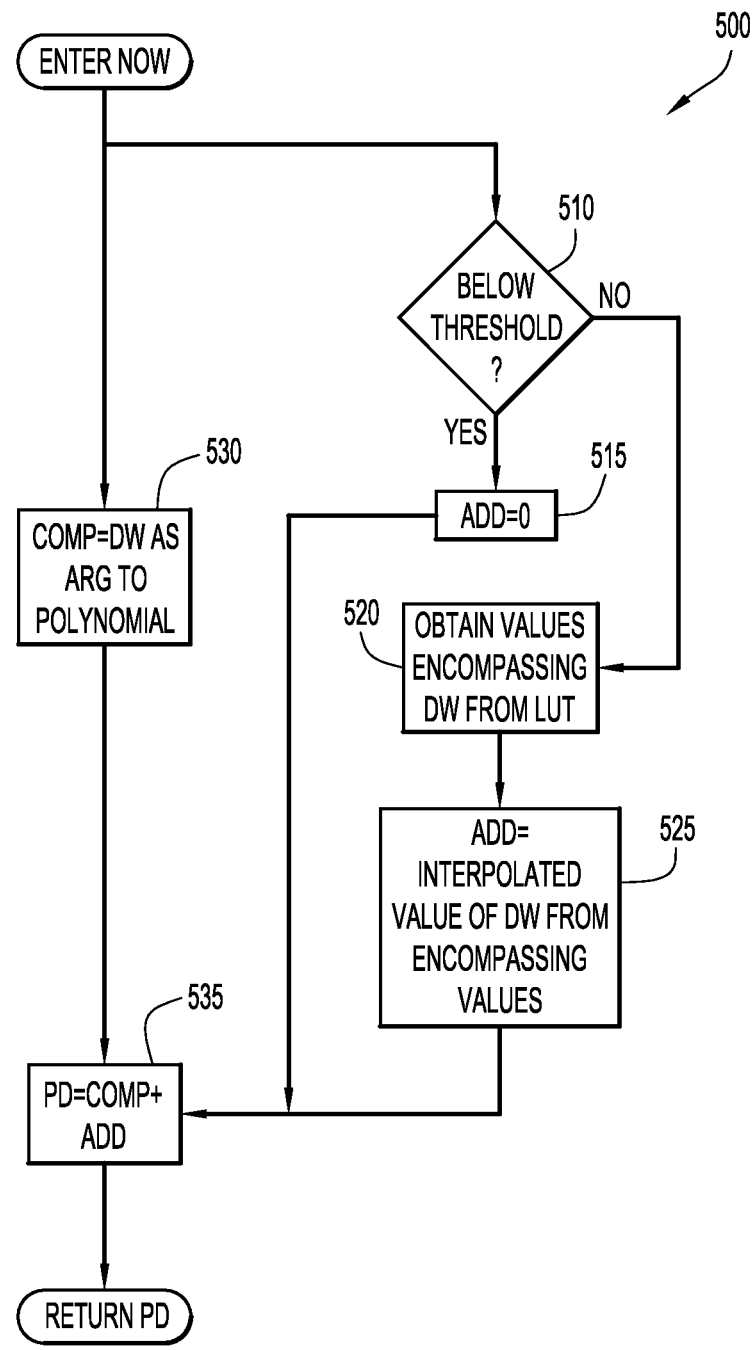
FIG. 5 is a flow diagram of an exemplary predistortion process by which the present general inventive process can be embodied.

FIG. 5 is a flow diagram of an exemplary predistortion process 500 by which the present invention can be embodied. Process 500 is entered with an input data word DW, which can be either an I data word or a Q data word; process 500 is performed on both in each of the I and Q data channels. In operation 510, it is determined whether the input data word DW is below a threshold. Such threshold may be established where values computed in multiplicative stage 315 no longer correspond to the target predistortion function. If the input data word DW is less than the threshold, i.e., the computed value of predistortion function matches the target predistortion function, then the additive value ADD is set to zero in operation 515 and process 500 transitions to operation 535. If, however, the input data word DW is greater than the threshold, values encompassing the input DW are retrieved from the LUT in operation 520 and interpolated in operation 525 to generate the additive value ADD. Meanwhile, in operation 530, input data word DW is provided as an argument to the polynomial implemented by multiplicative stage 315 to generate thereby computed data word COMP. In operation 535, the multiplicative term COMP is added to the additive term ADD to produce predistorted data word PD, which is returned as output from process 500.

Distortion in the DPA and any additional power amplifiers coupled to the DPA typically changes with temperature. In certain embodiments of the present invention, multiple LUT tables may be provided to compensate for temperature variations. For example, the additive term provided by LUTs 340$i$, 340$q$ may be modified based on the temperature read from, for example, an on-chip temperature sensor (not illustrated). Different LUT entries may be loaded from memory 101 in to the LUTs 340$i$, 340$q$ based on the sensed temperature. In certain embodiments, the polynomial implemented by predistortion function processor 320$i$, 320$q$ may be modified to compensate for temperature by using pre-calibrated stored values in the memory 101 for various temperature readings.

Figure 6:
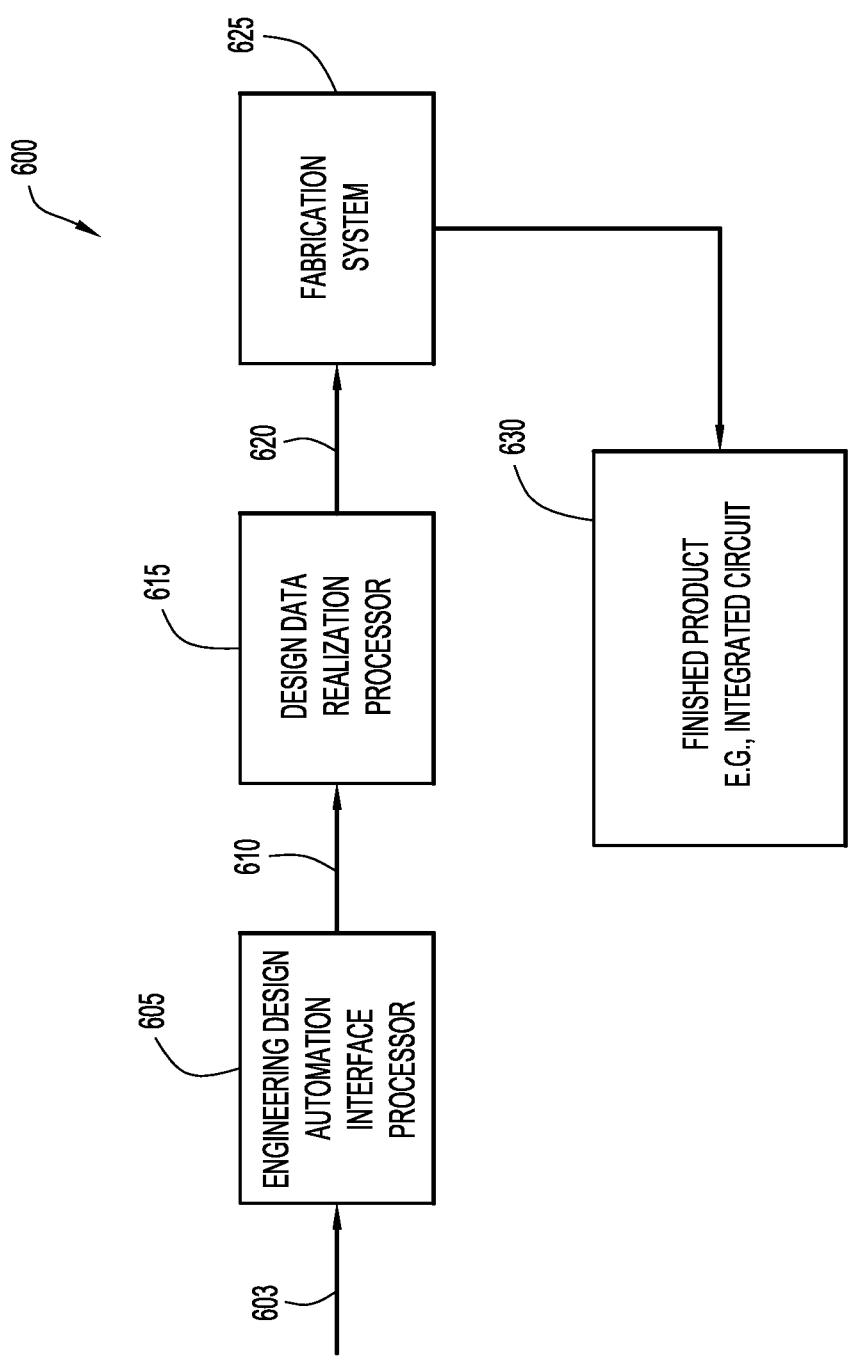
FIG. 6 is a block diagram of a circuit design and fabrication process by which a signal modulator circuit embodying the present general inventive concept may be fabricated.

Certain embodiments of the present invention provide for the functional components to be manufactured, transported, marketed and/or sold as processor instructions encoded on non-transitory computer-readable media. For example, one such computer-readable medium (not illustrated) may be provided to a circuit fabrication process 600, illustrated in FIG. 6, carrying processor instructions 603 that, when executed by an Electronic Design Automation (EDA) interface processor 605, a graphical representation of an embodiment of the present invention is presented to a user, such as on a display device (not illustrated). Through EDA interface 605, a circuit designer may incorporate the present invention into a larger circuit design. Once a circuit design has been completed, another non-transitory computer-readable medium (not illustrated) carrying other processor instructions 610, such as a hardware description language, may be provided to a design data realization processor 615. The design data realization processor 615 may convert the instructions 610 provided thereto into another set of processor instructions 620, by which a tangible integrated circuit 630 may be realized when executed by a circuit fabrication system 625. Such realization data 620 may include data to construct component and interconnect mask patterns, component placement location data, packaging data, and any other data necessary in a fabrication process to produce the finished circuit product 630. Other realization data 620 may include milling machine instructions and wiring instruction data, where the specific form of the realization data 620 is dependent on the type of circuit 630 in which the present invention is embodied.

Processor instructions 603, 610 and 620 may be encoded on non-transitory computer-readable media. The present general inventive concept, when so embodied, can be practiced regardless of the processing platform on which the processor instructions are executed and regardless of the manner by which the processor instructions are encoded on the computer-readable medium.

It is to be understood that the computer-readable medium described above may be any non-transitory medium on which the instructions 603, 610 and 620, as well as processor instructions that implement process 500 in FIG. 5, may be encoded and then subsequently retrieved, decoded and executed by a processor, where such media includes electrical, magnetic and optical storage devices. Examples of non-transitory computer-readable media include, but not limited to, read-only memory (ROM), random-access memory (RAM), and other electrical storage; CD-ROM, DVD, and other optical storage; and magnetic tape, floppy disks, hard disks and other magnetic storage. The processor instructions may be derived from algorithmic constructions in various programming languages that realize the present invention as exemplified by the embodiments described above.

The descriptions above are intended to illustrate possible implementations of the present inventive concept and are not restrictive. Many variations, modifications and alternatives will become apparent to the skilled artisan upon review of this disclosure. For example, components equivalent to those shown and described may be substituted therefore, elements and methods individually described may be combined, and elements described as discrete may be distributed across many components. The scope of the invention should therefore be determined not with reference to the description above, but with reference to the appended claims, along with their full range of equivalents.

What is claimed is:

1. An apparatus to receive a plurality of input in-phase (I) and quadrature (Q) data words provided from respective I and Q data channels, the apparatus comprising:

a digital power amplifier configured to generate a radio-frequency (RF) analog signal in accordance with a sequence of predistorted digital I and Q data words generated from the respective input I and Q data words and configured to generate maximum current when an input data word provided thereto is a full scale value; and
a predistortion processor, comprising:
a multiplicative stage to evaluate a predetermined predistortion function with each of the input I and Q data words as arguments to generate computed I and Q data words;
an additive stage to respectively generate additive I and Q data words, wherein the additive stage comprises a lookup table stored in a memory and containing the additive I and Q data words indexed by the respective input I and Q data words; and
an adder to add the additive I and Q data words to the respective computed I and Q data words to produce corresponding predistorted I and Q data words that compose the sequence of predistorted digital I and Q words used to generate the RF analog signal.

2. The apparatus of claim 1, wherein the multiplicative stage generates the computed I and Q data words to be substantially equal to the corresponding predistorted I and Q data words when the input I and Q data words are less than a predetermined threshold.

3. The apparatus of claim 2, wherein the additive stage generates the additive I and Q data words as non-zero values when the respective values of the input I and Q data words are greater than the predetermined threshold.

4. The apparatus of claim 2, wherein the multiplicative stage generates the computed I and Q data words to be less than the corresponding predistorted I and Q data words when the input I and Q data words are greater than the predetermined threshold.

5. The apparatus of claim 4, wherein the additive stage generates the additive I and Q data words as respective differences between the computed I and Q data words and the respective predistorted I and Q data words when the respective values of the input I and Q data words are greater than the predetermined threshold.

6. The apparatus of claim 4, wherein the multiplicative stage comprises a polynomial processor to generate the computed I and Q data words in accordance with a polynomial as the predistortion function.

7. The apparatus of claim 6, wherein the polynomial implemented by the polynomial processor is of polynomial order no greater than five (5).

8. The apparatus of claim 1, wherein the additive stage further comprises an interpolator to interpolate between the additive I and Q data words stored in the lookup table to generate an additive data word from neighboring additive data words.

9. A method comprising:
generating each of computed in-phase (I) and quadrature (Q) data words in accordance with a predetermined predistortion function evaluated with input I and Q data words as arguments;
generating additive I and Q data words, wherein generating the additive I and Q data words comprises retrieving the additive I and Q data words from a lookup table stored in a memory at indexes corresponding to the respective input I and Q data words;
adding the additive I and Q data words to the respective computed I and Q data words to produce corresponding predistorted I and Q data words; and
providing a sequence of the predistorted I and Q data words to the digital power amplifier to generate a radio-frequency analog signal converted therefrom.

10. The method of claim 9, wherein generating the computed I and Q data words comprises defining the predetermined predistortion function to evaluate substantially equal to the corresponding predistorted I and Q data words when the input I and Q data words are less than a predetermined threshold.

11. The method of claim 10, wherein generating the additive I and Q data words comprises generating the additive I and Q data words as non-zero values when the respective values of the input I and Q data words are greater than the predetermined threshold.

12. The method of claim 10, wherein generating the computed I and Q data words comprises defining the predetermined predistortion function to evaluate to less than the predistorted I and Q data words when the input I and Q data words used as arguments are greater than the predetermined threshold.

13. The method of claim 12, wherein generating the additive I and Q data words comprises generating the additive I and Q data words as respective differences between the computed I and Q data words and the respective predistorted I and Q data words when the respective values of the input I and Q data words are greater than the predetermined threshold.

14. The method of claim 12, wherein generating the computed I and Q data words comprises generating the computed I and Q data words in accordance with a polynomial.

15. A tangible non-transient computer readable medium having encoded thereon processor instructions that, when executed by a processor, configures the processor to:
generate each of computed in-phase (I) and quadrature (Q) data words in accordance with a predetermined predistortion function evaluated with input I and Q data words as arguments;
generate additive I and Q data words, by retrieving the additive I and Q data words from a lookup table stored in a memory at indexes corresponding to the respective input I and Q data words;
add the additive I and Q data words to the respective computed I and Q data words to produce corresponding predistorted I and Q data words; and
provide a sequence of the predistorted digital I and Q data words to the digital power amplifier to generate a radio-frequency analog signal converted therefrom.

16. The computer readable medium of claim 15 having instructions encoded thereon that configure the processor to generate the computed I and Q data words in accordance with a polynomial as the predetermined predistortion function.

17. The computer readable medium of claim 15 having instructions encoded thereon to configure the processor to store in the lookup table the additive I and Q data words as substantially equal to respective differences between the computed I and Q data words and the respective predistorted I and Q data words for values of the input I and Q data words that are greater than the predetermined threshold.

* * * * *